United States Patent
Oka et al.

(10) Patent No.: US 12,176,318 B2
(45) Date of Patent: *Dec. 24, 2024

(54) THERMAL COMPRESSION BONDER NOZZLE WITH VACUUM RELIEF FEATURES

(71) Applicant: Intel Corporation, Santa Clara, CA (US)

(72) Inventors: Mihir Oka, Chandler, AZ (US); Kartik Srinivasan, Gilbert, AZ (US); Wei Tan, Chandler, AZ (US); James Mellody, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/130,338

(22) Filed: Apr. 3, 2023

(65) Prior Publication Data

US 2023/0238352 A1 Jul. 27, 2023

Related U.S. Application Data

(63) Continuation of application No. 17/332,830, filed on May 27, 2021, now Pat. No. 11,652,080.

(51) Int. Cl.
  *B23K 3/00* (2006.01)
  *B23K 37/00* (2006.01)
  (Continued)

(52) U.S. Cl.
  CPC ............... *H01L 24/75* (2013.01); *B23K 3/00* (2013.01); *B23K 37/04* (2013.01);
  (Continued)

(58) Field of Classification Search
  CPC ........... H01L 24/75; H01L 2224/75251; H01L 2224/75252; H01L 2224/75303;
  (Continued)

(56) References Cited

U.S. PATENT DOCUMENTS 5,553,768 A 9/1996 Lasto et al.
6,182,884 B1 2/2001 Ma et al.
(Continued)

FOREIGN PATENT DOCUMENTS

CN 112838026 5/2001
CN 102668019 9/2012
(Continued)

OTHER PUBLICATIONS

Notice of Allowance from U.S. Appl. No. 17/332,830 notified Jan. 25, 2023, 11 pgs.
(Continued)

*Primary Examiner* — Kiley S Stoner
(74) *Attorney, Agent, or Firm* — Essential Patents Group, LLP (57) ABSTRACT

An apparatus comprising a bonding nozzle that has one or more channels in a bonding surface. The one or more channels comprise a first channel portion in an inner region of the bonding surface and a second channel portion along an outer periphery of the bonding surface. The one or more channels are in fluid communication with a vacuum port. A vacuum relief conduit within the bonding nozzle comprises a first opening into the second channel portion along the outer periphery of the bonding surface, and a second opening along an exterior wall of the bonding nozzle.

20 Claims, 7 Drawing Sheets

(51) Int. Cl.
    *B23K 37/04*     (2006.01)
    *H01L 23/00*     (2006.01)

(52) U.S. Cl.
    CPC ............... *H01L 2224/75251* (2013.01); *H01L 2224/75252* (2013.01); *H01L 2224/75303* (2013.01); *H01L 2224/75984* (2013.01)

(58) Field of Classification Search
    CPC ........... H01L 2224/75984; H01L 24/81; H01L 2224/131; H01L 2224/16227; H01L 2224/7531; H01L 2224/75745; H01L 2224/81203; B23K 1/00–206; B23K 3/00–087; B23K 37/04–06
    See application file for complete search history.

(56) References Cited

U.S. PATENT DOCUMENTS

| | | | |
|---|---|---|---|
| 6,196,439 B1 | 3/2001 | Mays et al. | |
| 6,257,564 B1* | 7/2001 | Avneri | B25B 11/005 269/21 |
| 6,347,734 B1 | 2/2002 | Downes | |
| 6,352,189 B1 | 3/2002 | Kobayashi | |
| 6,464,790 B1* | 10/2002 | Sherstinsky | H01L 21/6838 269/21 |
| 6,464,795 B1* | 10/2002 | Sherstinsky | H01L 21/6838 118/728 |
| 6,821,381 B1 | 11/2004 | Yamauchi | |
| 6,933,178 B1 | 8/2005 | Su | |
| 7,341,641 B2 | 3/2008 | Lee et al. | |
| 7,882,997 B2 | 2/2011 | Zakel et al. | |
| 7,980,445 B2 | 7/2011 | Budd et al. | |
| 8,297,486 B2 | 10/2012 | Kim | |
| 8,381,965 B2 | 2/2013 | Jang et al. | |
| 8,870,051 B2 | 10/2014 | Brofman et al. | |
| 8,919,634 B2 | 12/2014 | Igarashi et al. | |
| 9,282,650 B2 | 3/2016 | Dhavaleswarapu et al. | |
| 9,698,117 B2 | 7/2017 | Ha et al. | |
| 10,312,126 B1* | 6/2019 | Tan | H01L 21/6838 |
| 10,497,667 B2 | 12/2019 | Huang et al. | |
| 10,792,770 B1 | 10/2020 | Cleghorn et al. | |
| 2008/0318346 A1* | 12/2008 | Maki | H01L 22/20 257/E21.53 |
| 2009/0067114 A1 | 3/2009 | Balan | |
| 2010/0083494 A1 | 4/2010 | Lee et al. | |
| 2012/0074126 A1* | 3/2012 | Bang | H01L 21/67109 219/443.1 |
| 2012/0088362 A1 | 4/2012 | Hwang et al. | |
| 2013/0161879 A1 | 6/2013 | Tagami et al. | |
| 2014/0027068 A1 | 1/2014 | Hung et al. | |
| 2014/0202636 A1 | 7/2014 | Mayr et al. | |
| 2014/0252710 A1* | 9/2014 | Cuvalci | H01L 21/6875 269/21 |
| 2015/0129135 A1 | 5/2015 | Lee et al. | |
| 2015/0173209 A1 | 6/2015 | Dhavaleswarapu et al. | |
| 2015/0228612 A1 | 8/2015 | Ha et al. | |
| 2019/0067238 A1 | 2/2019 | McClain et al. | |
| 2019/0096848 A1 | 3/2019 | Huang et al. | |
| 2020/0038897 A1* | 2/2020 | Kamimura | H01L 21/6708 |
| 2021/0082867 A1 | 3/2021 | Kurosawa | |
| 2021/0111059 A1* | 4/2021 | Ulavi | C23C 16/4586 |
| 2021/0143044 A1 | 5/2021 | Oka et al. | |
| 2021/0288021 A1 | 9/2021 | Oka et al. | |

FOREIGN PATENT DOCUMENTS

| | | | | |
|---|---|---|---|---|
| CN | 106463444 A | * | 2/2017 | ......... G01N 21/9503 |
| CN | 108296935 | | 7/2018 | |
| CN | 110197805 A | * | 9/2019 | ....... H01L 21/67051 |
| JP | 06275664 A | * | 9/1994 | ............. H01L 24/75 |
| JP | H11284028 A | * | 10/1999 | |
| JP | 3303705 B2 | * | 7/2002 | ............. B23K 20/02 |
| JP | 2003218590 A | * | 7/2003 | |
| JP | 2004047670 A | * | 2/2004 | ............. H01L 24/75 |
| JP | 2006005183 A | * | 1/2006 | ............. H01L 24/75 |
| JP | 2009004403 A | * | 1/2009 | ....... H01L 21/67132 |
| KR | 20180082957 A | * | 7/2018 | |
| WO | 2022029916 | | 2/2022 | |

OTHER PUBLICATIONS

Restriction Requirement from U.S. Appl. No. 17/332,830 notified Sep. 26, 2022, 5 pgs.

* cited by examiner

THERMAL COMPRESSION BONDER NOZZLE WITH VACUUM RELIEF FEATURES

CLAIM OF PRIORITY

This application is a continuation of, and claims the benefit of priority to, U.S. patent application Ser. No. 17/332,830 filed on May 27, 2021 and titled "THERMAL COMPRESSION BONDER NOZZLE WITH VACUUM RELIEF FEATURES," which is incorporated by reference in its entirety.

BACKGROUND

Thermal compression bonding (TCB) tools may be employed in die attach operations during the package assembly of integrated circuit (ICs). Such tools may comprise a vacuum nozzle to hold a die in place by vacuum clamping the die to the nozzle. Alignment of the die with a substrate may be maintained by the vacuum nozzle, as the die is pressed against the substrate and held together between heated platens to which a mild compression force is applied. The aligned die and substrate are heated to enable reflow of first level interconnect (FLI) solder bumps on die or substrate. While securely clamped in place by the vacuum nozzle, the die undergoes bonding to the substrate as platens are heated to solder liquidus temperatures. Solder bumps on the die and/or substrate reflow to form FLI solder joints between die and substrate as the platens cool below reflow temperatures.

While the die may be securely clamped by the vacuum nozzle during the reflow operation, the alignment accuracy between die and substrate interconnects may be degraded by non-uniform thermal expansion and contraction of the die relative to the substrate during the reflow operation. The non-uniform thermal expansion and contraction of the die may be caused by pinning of the die at corners and edges of the vacuum nozzle by strong vacuum, constraining normal thermal expansion of the die while the substrate undergoes free thermal expansion. As a result, there may be a misalignment of die and substrate interconnects before and during FLI reflow, which may worsen with larger dies. The offset between interconnect centers may be as much as 10 microns. In addition, pinning of the die during heating may cause die warpage leading to large gaps, as much as 15 microns, in the bonding plane between die and substrate and non-bonded contacts.

DETAILED DESCRIPTION

Disclosed herein is a vacuum bonding nozzle for use in thermal compression bonding tools. According to some embodiments, the vacuum bonding nozzle comprises vacuum relief conduits on the periphery of its bonding surface to weaken the vacuum seal and clamping of the peripheral regions of a die, while maintaining adequate seal and clamping force in the interior regions of the die to hold the die firmly against the bonding surface of the nozzle to maintain alignment between a die and a substrate during die attachment operations. The disclosed vacuum bonding nozzle may mitigate pinning of the periphery of the die against the bonding surface of the vacuum bonding nozzle, enabling free thermal expansion and contraction of the die during the reflow phase of the die attach process. The disclosed vacuum bonding nozzle may thus enable the die to expand and contract in phase with the substrate, mitigating first-level interconnect (FLI) misalignment. Peripheral pinning may also cause warpage of the die, leading to gaps between die and substrate, with non-bonded contacts. Reduction of peripheral clamping forces by employment of the disclosed bonding nozzle in die attach processes may also reduce gaps in the bonding plane by mitigation of die warpage from constrained thermal expansion.

The disclosed vacuum bonding nozzle comprises a bonding surface comprising a network of interconnected channels. The network of channels includes a first channel portion comprising interior channels within a central portion of the bonding surface, and a second channel portion comprising peripheral channels extending along the periphery of the bonding surface. The peripheral channels may be joined to interior channels extending to the center of the bonding surface. Interior channels may intersect a central conduit extending perpendicularly from the bonding surface through the vacuum bonding nozzle, terminating at a vacuum port at the top of the vacuum bonding nozzle. The interior channels couple the peripheral channels to the vacuum conduit, which may be coupled to a vacuum source. In some embodiments, the bonding surface has a rectangular footprint. Peripheral channels may extend along each of the four orthogonal edges of the bonding surface. Adjacent ends of the peripheral channels may be joined to each other to form a contiguous ring around the perimeter of the bonding surface.

Vacuum relief conduits intersect and open into one or more peripheral channels near the corners of the bonding surface. The vacuum relief conduits may be machined into the body of the vacuum bonding nozzle, extending to one or more walls of the vacuum bonding nozzle. The vacuum relief conduits may open to an ambient atmosphere surrounding the bonding nozzle. One vacuum relief conduit may intersect a peripheral channel near an end of the channel, for example, near the corners of the bonding surface. In some embodiments, one or more of the peripheral channels on a rectangular bonding surface may be each intersected by a first vacuum relief conduit at a first end, and by a second vacuum relief conduit at a second end. In some embodiments, a third vacuum relief conduit may intersect one or more of the peripheral channels between the first and second vacuum relief conduits.

The vacuum relief conduits provide controlled vacuum leaks (e.g., air or other ambient atmosphere leaks into the nozzle). The controlled vacuum leaks through the vacuum relief conduits enable a vacuum gradient to form within the channel network when the vacuum bonding nozzle is connected to a vacuum source, such as an active vacuum pump. The vacuum may be weakest (e.g., the gas pressure highest) within the peripheral channels due to the to the vacuum relief conduits being fluidically coupled to one or more of the peripheral channels. Thus, the clamping force of the disclosed vacuum bonding nozzle along the periphery of an IC die to which the bonding nozzle is engaged may be significantly smaller than the clamping force on the central portion of the die.

By establishment of a radial or other vacuum gradient within the channel network enables a distribution of clamping force on the IC die. As an example, a vacuum gradient may be formed within the first and second channel portions such that the clamping force on an engaged IC die may be highest within a central region of an IC die interfaced to the bonding surface. The central clamping force may be sufficient to prevent movement of the IC die during alignment with a package substrate and subsequent temperature cycling for solder reflow. While vacuum clamping may be strongest within a central region of the bonding surface and IC die. The vacuum clamping force may diminish in a radial manner within the interior channels as they approach the peripheral channels. As a result, clamping forces may be lowest at the periphery of the boding surface, enabling the peripheral regions of the IC die to undergo relatively unrestrained thermal expansion in response to temperature cycling (e.g., for solder reflow).

With a conventional bonding nozzle, vacuum clamping forces may not be distributed in a gradient (e.g., in a radial manner), whereby clamping forces at the periphery of the bonding surface are substantially the same as clamping forces within the central region of the bonding surface, enabling pinning of peripheral regions of the IC die. Natural thermal expansion and contraction of the IC die may be prevented or impeded during a heating and cooling cycles, for example, in a thermal compression bonding tool. Two consequences may occur as a result. First, the substrate may not be so constrained and may be free to expand, creating a misalignment between die and substrate. Offsets as large as 10 microns between die and substrate interconnects. Second, while the die is constrained from expanding laterally, significant transverse buckling and warpage may occur, whereby significant gaps may develop between die and substrate. Such gaps may create non-bonded states for some interconnects as die interconnects are raised well above substrate contacts.

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

Figure 1A:
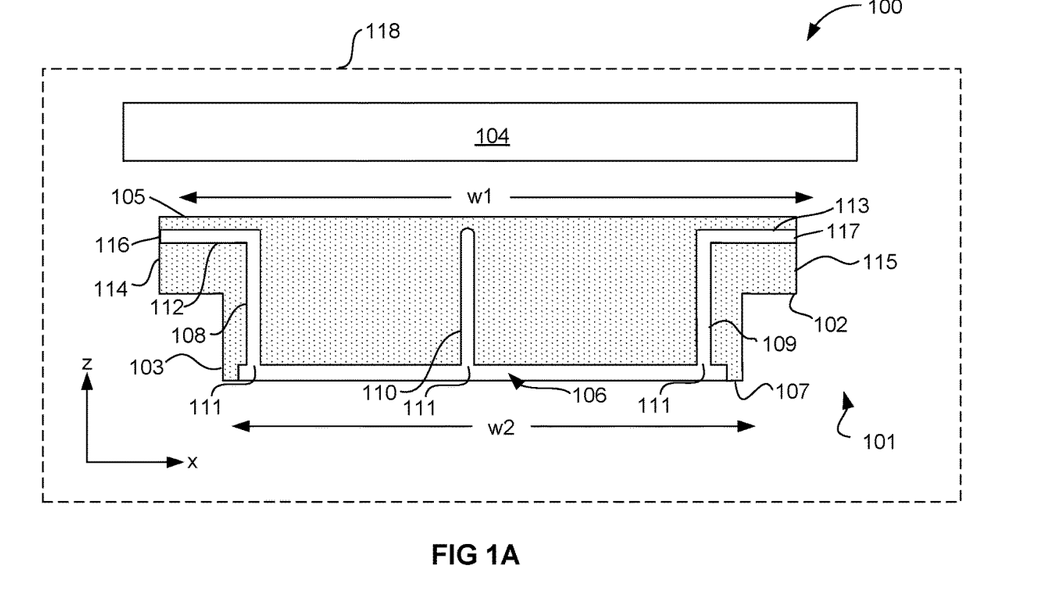
FIG. 1A illustrates a cross-sectional view in the x-z plane of a vacuum bonding nozzle according to some embodiments of the disclosure.

FIG. 1A illustrates a cross-sectional view in the x-z plane of vacuum bonding nozzle 100 according to some embodiments of the disclosure.

Vacuum bonding nozzle 100 comprises body 101, machined or cast into suitable shapes such as the T-shaped profile shown in the figure. Body 101 may comprise metals such as copper, steel, brass and aluminum, or any suitable material that may withstand solder reflow temperatures (e.g., temperatures exceeding 200°-250° C.). In some embodiments, body 101 comprises stage 102 and base 103. Stage 102 may have a substantially larger width w1 than base w2, and may overhang sidewalls of base 103. A larger width w1 of stage 102 (with respect to width w2) may enable even distribution of forces from heating platen 104 when engaged with upper surface 105 of stage 102 (it will be understood that platen 104 is not a part of vacuum bonding nozzle 100, but is shown for context). Peripheral channel 106 extends within lower bonding surface 107, and may extend along most of width w2 of base 103. As shown below, peripheral channel 106 extends along the perimeter of base 103.

In the illustrated embodiment, vacuum relief conduits 108 and 109 intersect peripheral channel near each end. A third vacuum relief conduit 110 may optionally intersect peripheral channel 106 between vacuum relief conduits 108 and 109. For example, vacuum relief conduit 110 may intersect peripheral channel 106 near the center, as shown. Orifices 111 are the openings of vacuum relief conduits 108, 109 and 110 into peripheral channel 106. Vacuum relief conduits 108, 109 and 110 may rise vertically (in the z-direction) above bonding surface 107. Vacuum relief conduits may also include horizontal portions 112 and 113 extending laterally (in the x-direction) to opposing walls 114 and 115, respectively. Middle vacuum relief conduit 110 may also has a horizontal portion (not shown) that extends along the y-axis of the figure, above and below the plane of the figure. Horizontal portions 112 and 113 intersect opposing walls 114 and 115, forming orifices 116 and 117 at the planes of intersection, whereby orifices 116 and 117 open to ambient atmosphere 118 (indicated by the dashed enclosure) that surrounds vacuum bonding nozzle 100.

In some embodiments, horizontal portions 112 and 113 may intersect the same wall (e.g., wall 114) or orthogonal walls. In some embodiments, horizontal portions 112 and 113 may also intersect walls of base 103, it may be advantageous to locate orifices 116 and 117 at the furthest possible distance from bonding surface 107 to avoid pulling solder and flux vapors into the vacuum system.

Figure 1B:
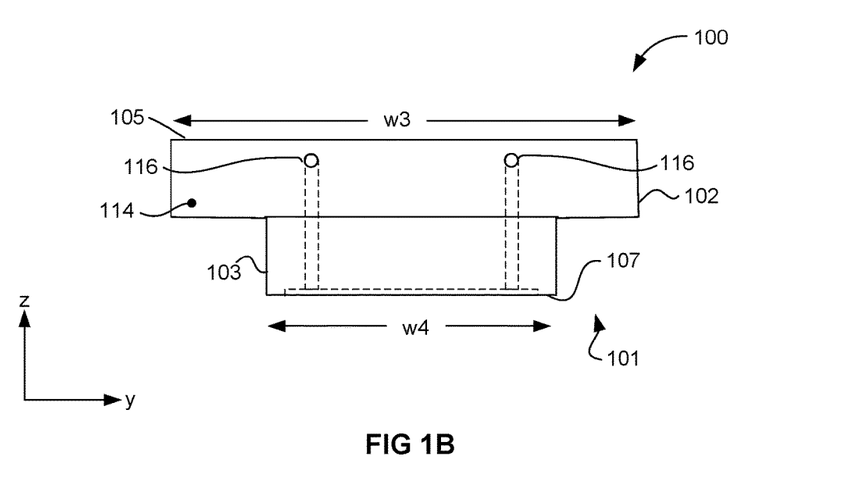
FIG. 1B illustrates a profile view in the y-z plane of a vacuum bonding nozzle according to some embodiments of the disclosure.

FIG. 1B illustrates a rotated profile view of vacuum bonding nozzle 100 in the y-z plane, according to some embodiments of the disclosure.

The profile view of vacuum bonding nozzle 100 is rotated 90° to the y-z plane to show orifices 116 at planes of intersection of horizontal portions 112 vacuum relief conduits with sidewall 114. Hidden lines indicate positions of a peripheral channel extending along bonding surface 107 parallel to sidewall 114 and vacuum relief conduits (e.g., vacuum relief conduits 108) within body 101 that terminate at orifices 116 on sidewall 114. In some embodiments, stage 102 and base 103 have a rectangular footprint. As shown in FIGS. 1A and 1B, both stage 102 and base 103 have shorter widths w3 and w4, respectively, along the y-axis than along the x-axis. (e.g., w1>w3, w2>w4).

Figure 1C:
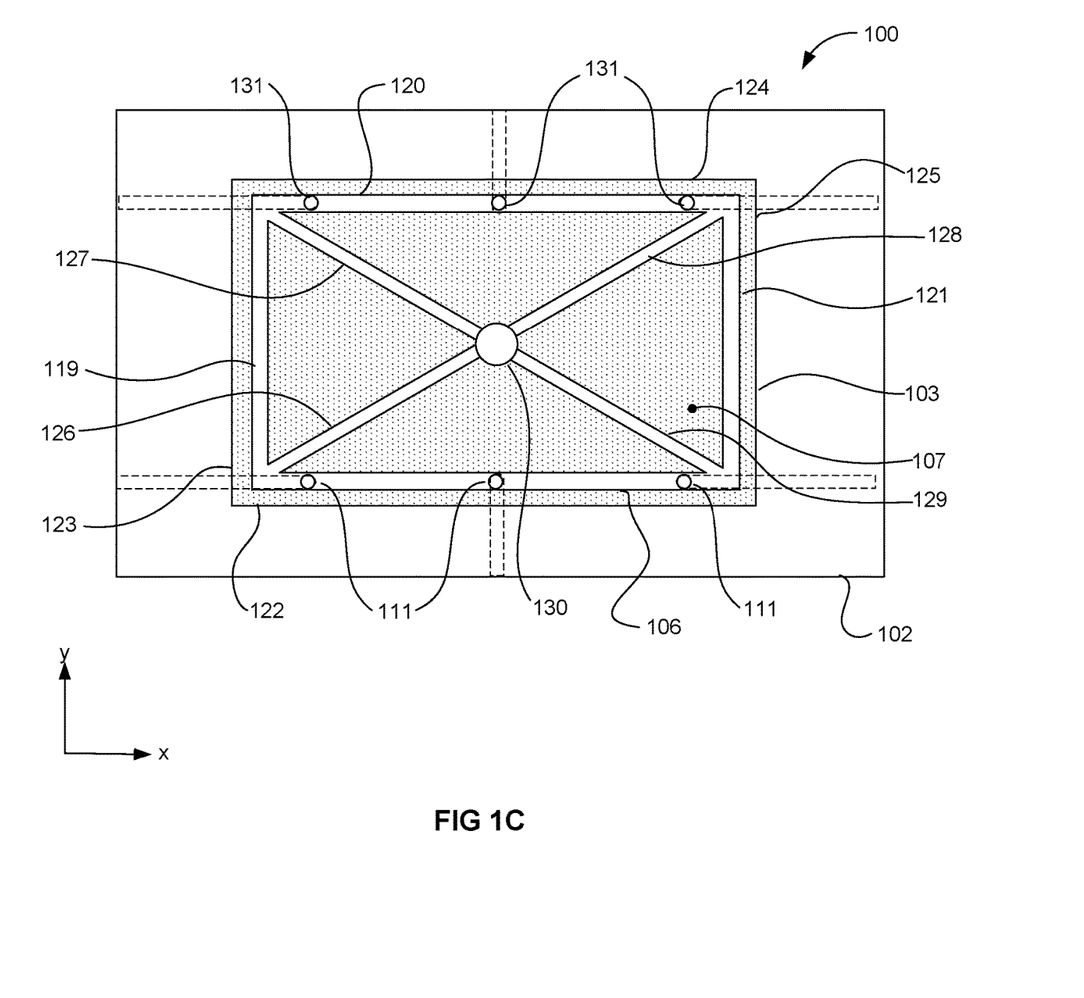
FIG. 1C illustrates a plan view in the x-y plane of a vacuum bonding nozzle according to some embodiments of the disclosure.

FIG. 1C illustrates a plan view in the x-y plane of vacuum bonding nozzle 100 according to some embodiments of the disclosure.

Peripheral channels 106, 119, 120 and 121 extend along the periphery of bonding surface 107, having edges that coincide with sidewalls 122, 123, 124 and 125 of base 103. In the illustrated embodiment, ends of peripheral channels 119 and 121 on opposing edges of bonding surface 107 join ends of orthogonal peripheral channels 106 and 120, forming a contiguous ring channel extending along the perimeter of bonding surface 107. Interior channels 126, 127, 128 and 129 extend in a radial configuration between the center and the periphery of bonding surface 107. In the illustrated embodiment, each of interior channels 126-129 opens into vacuum conduit 130 at a first end. Channels of the channel network may be grooves milled or otherwise engraved into bonding surface 107, recessed to a depth of 0.1 to 2 millimeters from the plane of bonding surface 107. The channels may have any suitable cross section width. In some embodiments, interior channels 126-129 may have a tapered cross section, as described below.

While interior channels 126-129 are shown in the illustrated embodiment extending in a radial geometry to the corners of bonding surface 107, other suitable geometries may be considered for extending interior channels 126-129 to intersect with peripheral channels 106, 119, 120 and 121. While interior channels 126-129 are shown to have a constant channel cross section in the illustrated embodiment, in some embodiments interior channels 126-129 may have a tapered cross section, for example, having a wide cross section at the intersection with peripheral channels, and a narrow cross section at the intersection with central vacuum conduit 130. A taper within the channel cross section may create a venturi effect with interior channels 126-129, potentially enhancing vacuum gradients created when the bonding nozzle is coupled to an active vacuum source. In some embodiments, a taper may be engineered for optimal distribution of clamping forces on an engaged IC die.

Vacuum conduit 130 terminates at an orifice at the center of bonding surface 107. Vacuum conduit 130 may extend vertically (e.g., in z-direction perpendicular to the figure) from bonding surface 107, through base 103 to the upper surface of stage 102 (e.g., upper surface 105 in FIG. 1A). Interior channels 126-129 extend radially, each toward a corner region of bonding surface 107. Interior channels 126-129 may join peripheral channels 106, 119, 120 and 121 at or near their points of intersection, for example, near the corners of bonding surface 107.

The network of bonding nozzle channels comprising interior channels 126-129 and peripheral channels 106, 119-121 are coupled to vacuum conduit 130. Vacuum relief conduits (e.g., vacuum relief conduits 108-110) open into peripheral channels 106 and 120, forming orifices 111 and 131. The vacuum relief conduits may enable controlled leakage of air or other atmospheric gases for vacuum relief along peripheral channels 106 and 120. Vacuum relief conduits may also terminate at other peripheral channels. In some embodiments, only one or two vacuum relief conduits may intersect each peripheral channel. For example, one vacuum relief conduit may intersect a peripheral channel at an end or between ends.

Figure 2A:
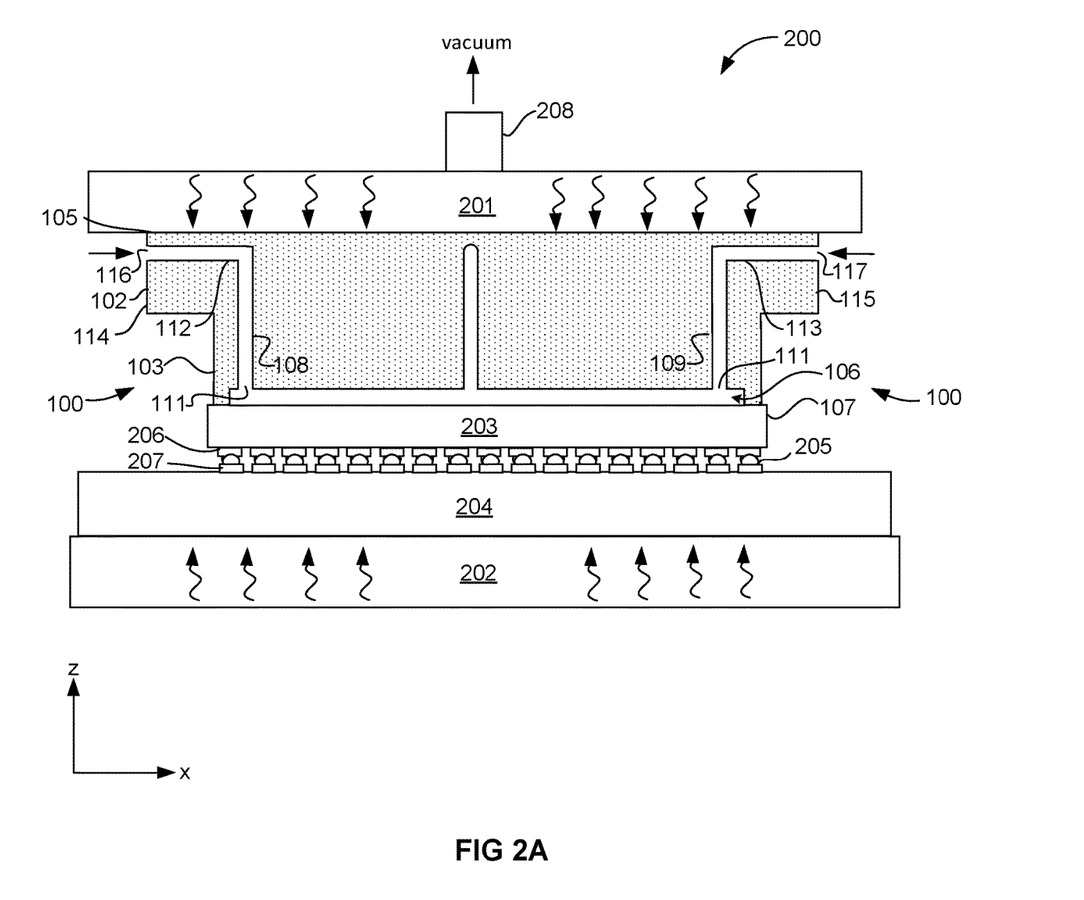
FIG. 2A illustrates a cross-sectional view in the x-z plane of a bonding nozzle employed in a thermal compression bonder, according to some embodiments of the disclosure.

FIG. 2A illustrates a cross-sectional view in the x-z plane of bonding nozzle 100 employed in thermal compression bonder 200, according to some embodiments of the disclosure.

The cross-sectional view plane of thermal compression bonder 200 cuts through peripheral channel 106. Thermal compression bonder 200 comprises upper and lower heating platens 201 and 202, which may be engaged by a vise-like mechanism within bonder 200 (not shown) for pressing heating platens 201 and 202 together. In the illustrated embodiment, die 203 is aligned with substrate 204 such that solder bumps 205 align to die interconnects 206 or substrate interconnects 207. Platens 201 and 202 may be heated (indicated by wavy arrows showing direction of heat flow) to reflow solder bumps 205 to form FLI solder joints between die interconnect 206 and substrate interconnects 207. Die 203 may be vacuum clamped to bonding surface 107 of bonding nozzle 100. A vacuum may be applied to bonding nozzle 100 by engaging upper platen 201 with top surface 105 of stage 102, where a seal may be formed between vacuum port 208 on upper platen 201 and a central vacuum conduit (e.g., vacuum conduit 130) extending through base 103 and stage 102 of bonding nozzle 100. coupling bonding nozzle 100 to a vacuum system through vacuum port 208.

Peripheral conduit 106 may be coupled to vacuum port 208 through the channel network on bonding surface 107, as illustrated in FIG. 1C. The channel network comprises peripheral channels (e.g., peripheral channel 106, 119-121) extending around the perimeter of bonding surface 107 and interior channels (e.g., interior channels 126-129, FIG. 1C) extending between vacuum conduit (e.g., vacuum channel 130) and peripheral channels (e.g., peripheral channels 106, 119-121).

Vacuum relief conduits 108, 109 and 110 open into peripheral channel 106 through orifices 111. When a vacuum pump is coupled to the channel network through vacuum port 208, air flows out of vacuum port 208, as indicated by the vertical arrow pointing away from vacuum port 208. A continuous flow may be established, whereby air or other ambient gases may leak into peripheral channel 106 through openings 116 and 117 on sidewalls 114 and 115. The vacuum flow is indicated by the horizontal arrows pointing into openings 116 and 117.

Figure 2B:
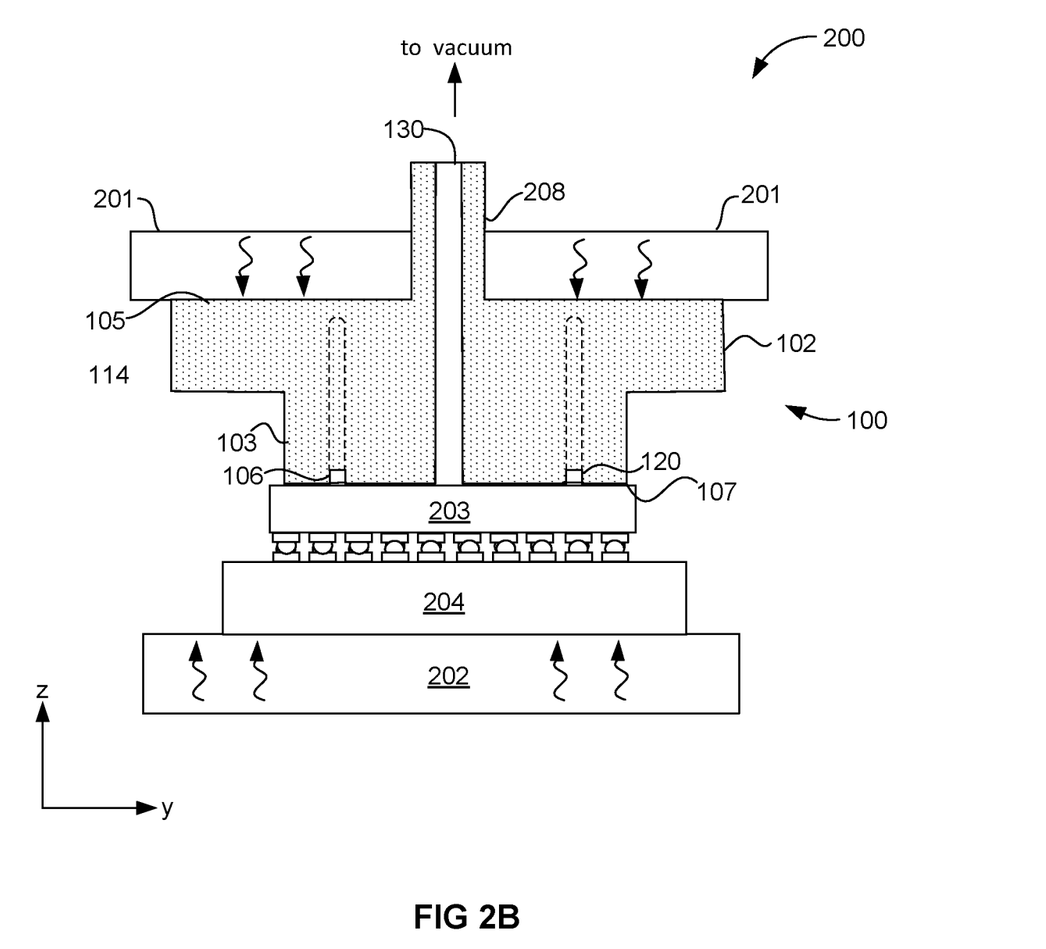
FIG. 2B illustrates a cross-sectional view in the y-z plane of a bonding nozzle employed in a thermal compression bonder, according to some embodiments of the disclosure.

FIG. 2B illustrates a cross-sectional view in the y-z plane of bonding nozzle 100 employed in thermal compression bonder 200, according to some embodiments of the disclosure.

Thermal compression bonder 200 is rotated 90° to show another cross-sectional view taken through a central y-z plane. Central vacuum conduit 130 is shown extending from bonding surface 107, where it exerts the greatest suction force on die 203, through vacuum port 208/While not shown in the cross-sectional view, vacuum conduit 130 is coupled through interior channels (e.g., interior channels 126 and 129) to peripheral channels 106 and 120, extending along opposite sidewalls 122 and 124.

Vacuum conduit 130 may be coupled to the vacuum system of the thermal compression bonder tool, which may be coupled to an external vacuum pump (not shown).

Figure 3:
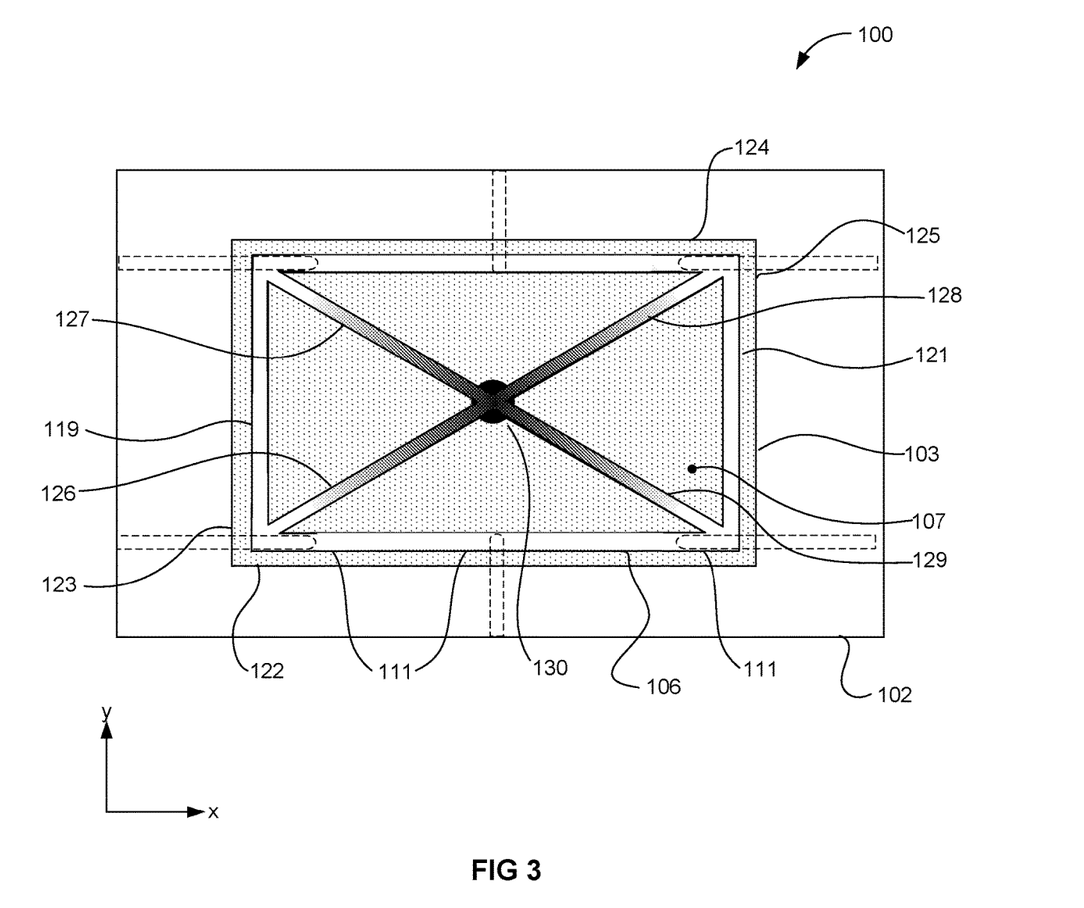
FIG. 3 illustrates a plan view in the x-y plane of a vacuum bonding nozzle, showing vacuum gradients within the channel network on a bonding surface when coupled to an active vacuum pump, according so some embodiments of the disclosure.

FIG. 3 illustrates a plan view in the x-y plane of vacuum bonding nozzle 100, showing vacuum gradients within the channel network on bonding surface 107 when coupled to a vacuum source, according so some embodiments of the disclosure.

During a die attach process for example, vacuum gradients may be established within the channel network comprising peripheral channels 106, 119-121 and interconnected interior channels 126-129. Vacuum gradients are indicated by shading gradations within interior channels 126-129, where black indicates the strongest vacuum and white indicates the weakest vacuum, with shades of gray indicating intermediate levels of vacuum. As shown, the vacuum is strongest at the center of bonding surface 107, particularly within vacuum channel 130. The vacuum gradient extends laterally within interior channels 126-129 and weakens as it approaches the periphery of bonding surface 107. As shown, vacuum gradients may not occur within peripheral channels 106, 119-121. Air or other ambient gases may enter peripheral channels through orifices 111 and 131 where vacuum relief conduits open into the peripheral channels. Air may fill the peripheral channels while flowing up the four interior channels toward vacuum conduit 130 at the center of bonding surface 107.

Vacuum relief conduits (e.g., vacuum relief conduits 108) may be dimensioned to produce small air leakage into the peripheral channels. For example, the diameters of orifices 111 and 131 (and diameters of vacuum relief conduits also) may be dimensioned to permit a leakage rate that approximates the vacuum flow rate. The vacuum may also be adjusted to attain an air leakage rate that enables formation of a vacuum gradient within the channel network such as that shown in FIG. 3

The vacuum gradient shown in FIG. 3 may provide sufficient clamping force in the central portion of a die (e.g., die 203) engaged by vacuum bonding nozzle 100, as shown in FIG. 2, to prevent lateral displacement. Clamping force at the periphery of the die may be significantly weaker relative to the central portion of the die, as a consequence of the low vacuum within peripheral channels. As a result, pinning of corners and edges of the die may be substantially mitigated, enabling unrestrained thermal expansion and contraction of the edges and corners of the die according to the temperature cycle phase imposed by the thermal compression bonder.

Lateral misalignment of die and substrate interconnects may be significantly mitigated. For example, bump misalignment may be reduced by an average of 10 microns in comparison to displacements when a conventional bonding nozzle is employed in the die attach process. Similarly, warpage of the die and formation of FLI gaps between die and substrate may also be substantially mitigated. For example, a reduction of gap variation by an average of 15 microns may be obtained relative to observed gap variation when employing conventional bonding nozzles not having the disclosed vacuum relief conduits. The improvements in FLI alignment realized by including vacuum relief features such as vacuum relief conduits as descried above may result in higher product yields than would be possible with a conventional vacuum bonding nozzle.

Figure 4:
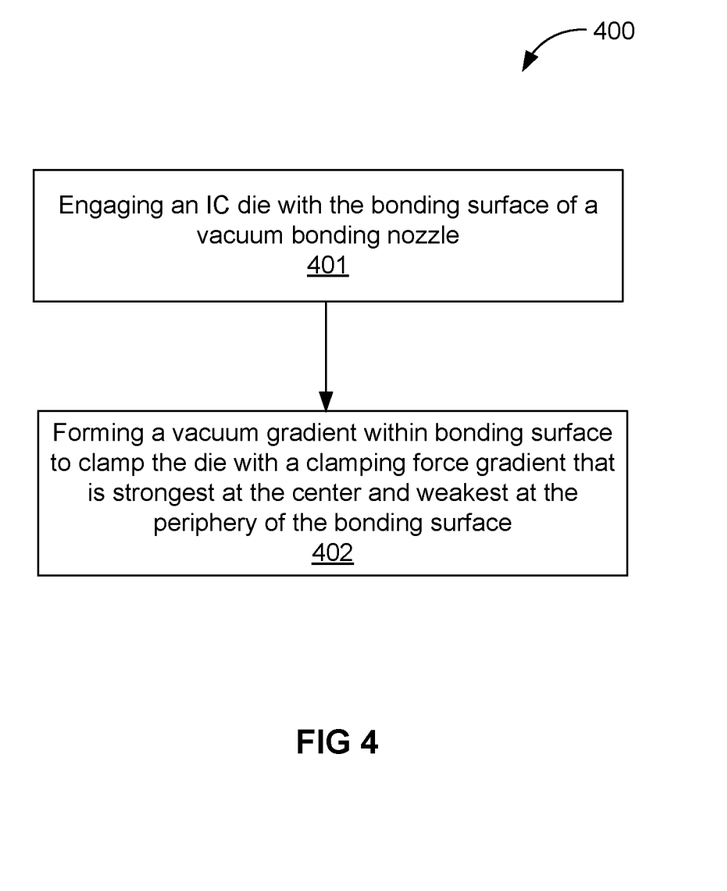
FIG. 4 illustrates a process flow chart for using the disclosed vacuum bonding nozzle according to some embodiments of the disclosure.

FIG. 4 illustrates process flow chart 400 for using the disclosed vacuum bonding nozzle according to some embodiments of the disclosure.

At operation 401, a die is prepared for bonding to a package substrate. The die and and/or individual substrate may be bumped with solder on all interconnects, and placed in a thermal compression bonder tool as shown in FIG. 2. The die (e.g., die 203) is brought in contact with a vacuum bonding nozzle having vacuum relief features (e.g., bonding nozzle 100), according to embodiments described above. The die may be pressed against the bonding surface of the vacuum bonding nozzle. A jig may be employed to immobilize the die and substrate pair.

The die may be pre-aligned with an individual package substrate (e.g., substrate 204), where both package and die are held in proximity of one another in an alignment jig. Precise alignment between die and substrate may be achieved by automated pick-and-place operations. Alignment may also be performed at wafer level, where multiple unsingulated substrate chips carried on a wafer or panel may be aligned with individual IC dies by automated placement processes.

At operation 402, the die and substrate may be placed in a jig that is set between two heating platens (e.g., upper and lower platens 201 and 202) of a thermal compression bonder tool. Upper and lower heating platens may be moved toward each other, compressing the die and substrate against each other with mild force. A vacuum source may be coupled to a vacuum bonding nozzle (e.g., through vacuum port 208) coupled to the channel network of the vacuum bonding nozzle, creating a vacuum with the channel network to securely clamp the die to the bonding nozzle.

As vacuum relief conduits enable air leakage into the channel network, a vacuum gradient may be established within the channel network. The vacuum gradient may be established such that the vacuum may increase inwardly from the periphery toward the center of the bonding nozzle. Peripheral channels may carry a relatively weak vacuum such that clamping forces. As noted above, clamping forces at the periphery of the die may be weaken so as not to pin the corners and edges of the die against the bonding surface, enabling unconstrained thermal expansion and contraction of the die. Alignment between die and substrate interconnects may be substantially maintained as described above.

Figure 5:
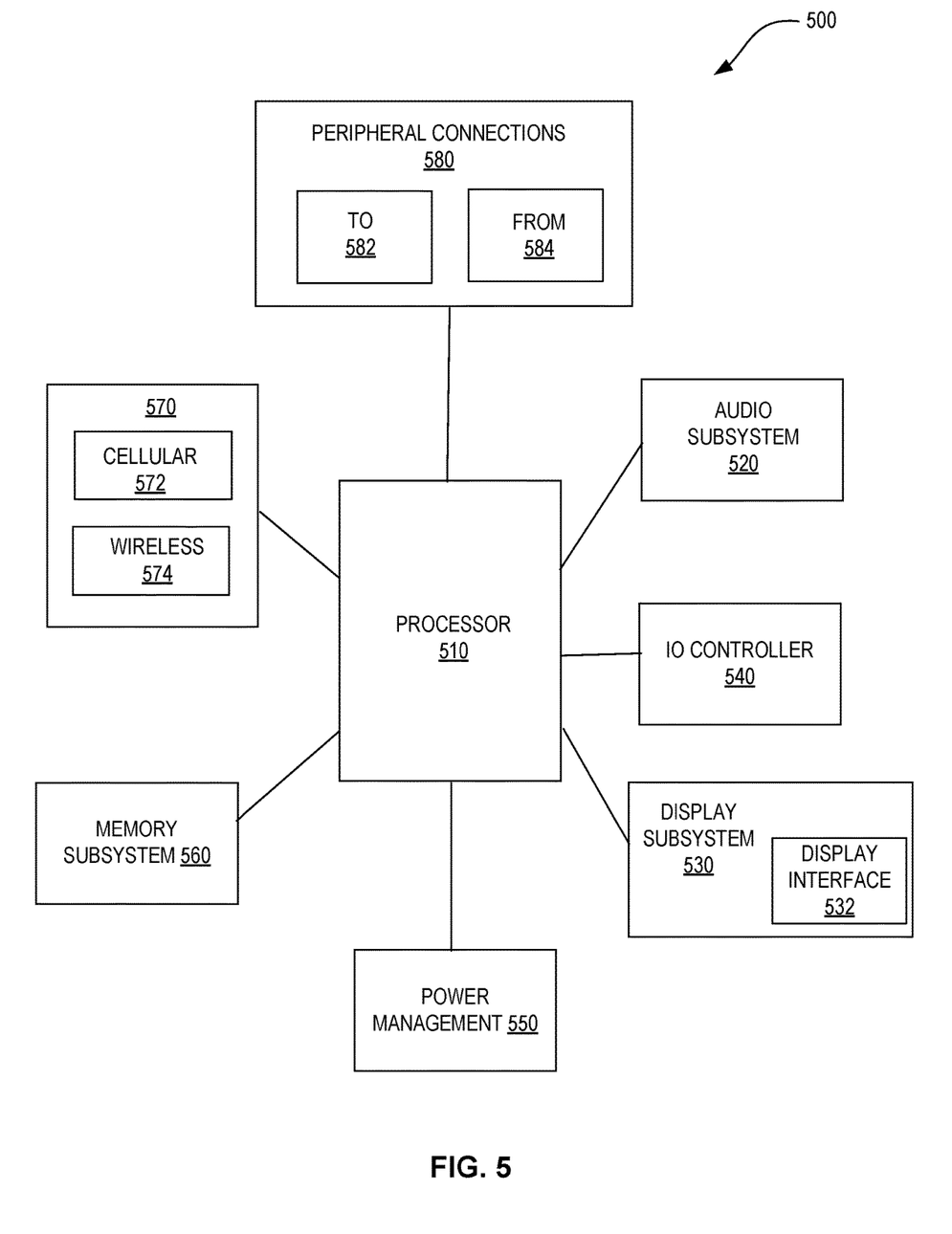
FIG. 5 illustrates a block diagram of a computing device as part of a system-on-chip (SoC) package in an implementation of one or more integrated circuit dies attached to a substrate in a thermal compression bonder employing a vacuum bonding nozzle according to some embodiments of the disclosure.

FIG. 5 illustrates a block diagram of computing device 500 as part of a system-on-chip (SoC) package in an implementation of one or more integrated circuit dies attached to a substrate in a thermal compression bonder employing a vacuum bonding nozzle according to some embodiments of the disclosure.

According to some embodiments, computing device 500 represents a server, a desktop workstation, or a mobile workstation, such as, but not limited to, a laptop computer, a computing tablet, a mobile phone or smart-phone, a wireless-enabled e-reader, or other wireless mobile device.

In some embodiments, computing device has wireless connectivity (e.g., Bluetooth, WiFi and 5G network). It will be understood that certain components are shown generally, and not all components of such a device are shown in computing device 500.

The various embodiments of the present disclosure may also comprise a network interface within 570 such as a wireless interface so that a system embodiment may be incorporated into a wireless device, for example, cell phone or personal digital assistant. The wireless interface includes a millimeter wave generator and antenna array. The millimeter wave generator may be part of a monolithic microwave integrated circuit.

According to some embodiments, processor 510 represents a CPU or a GPU, and can include one or more physical devices, such as microprocessors, application processors, microcontrollers, programmable logic devices, or other processing means. Processor 510 may be coupled to a memory controller or high-speed serial I/O interface controller, as disclosed. The processing operations performed by processor 510 include the execution of an operating platform or operating system on which applications and/or device functions are executed. The processing operations include operations related to I/O (input/output) with a human user or with other devices, operations related to power management, and/or operations related to connecting the computing device 500 to another device. The processing operations may also include operations related to audio I/O and/or display I/O.

In one embodiment, computing device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 500, or connected to the computing device 500. In one embodiment, a user interacts with the computing device 500 by providing audio commands that are received and processed by processor 510

Display subsystem 530 represents hardware (e.g., display devices) and software (e.g., drivers) components that provide a visual and/or tactile display for a user to interact with the computing device 500. Display subsystem 530 includes display interface 532 which includes the particular screen or hardware device used to provide a display to a user. In one embodiment, display interface 532 includes logic separate from processor 510 to perform at least some processing related to the display. In one embodiment, display subsystem 530 includes a touch screen (or touch pad) device that provides both output and input to a user.

I/O controller 540 represents hardware devices and software components related to interaction with a user. I/O controller 540 is operable to manage hardware that is part of audio subsystem 520 and/or display subsystem 530. Additionally, I/O controller 540 illustrates a connection point for additional devices that connect to computing device 500 through which a user might interact with the system. For example, devices that can be attached to the computing device 500 might include microphone devices, speaker or stereo systems, video systems or other display devices, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of the computing device 500. Additionally, audio output can be provided instead of, or in addition to display output. In another example, if display subsystem 530 includes a touch screen, the display device also acts as an input device, which can be at least partially managed by I/O controller 540. There can also be additional buttons or switches on the computing device 500 to provide I/O functions managed by I/O controller 540.

In one embodiment, I/O controller 540 manages devices such as accelerometers, cameras, light sensors or other environmental sensors, or other hardware that can be included in the computing device 500. The input can be part of direct user interaction, as well as providing environmental input to the system to influence its operations (such as filtering for noise, adjusting displays for brightness detection, applying a flash for a camera, or other features).

In one embodiment, computing device 500 includes power management 550 that manages battery power usage, charging of the battery, and features related to power saving operation. Memory subsystem 560 includes memory devices for storing information in computing device 500. Memory can include nonvolatile (state does not change if power to the memory device is interrupted) and/or volatile (state is indeterminate if power to the memory device is interrupted) memory devices. Memory subsystem 560 can store application data, user data, music, photos, documents, or other data, as well as system data (whether long-term or temporary) related to the execution of the applications and functions of the computing device 500.

Elements of embodiments are also provided as a machine-readable medium (e.g., memory 560) for storing the computer-executable instructions. The machine-readable medium (e.g., memory 560) may include, but is not limited to, flash memory, optical disks, CD-ROMs, DVD ROMs, RAMS, EPROMS, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 570 includes hardware devices (e.g., wireless and/or wired connectors and communication hardware) and software components (e.g., drivers, protocol stacks) to enable the computing device 500 to communicate with external devices. The computing device 500 could be separate devices, such as other computing devices, wireless access points or base stations, as well as peripherals such as headsets, printers, or other devices.

Network interface 570 can include multiple different types of connectivity. To generalize, the computing device 500 is illustrated with cellular connectivity 572 and wireless connectivity 574. Cellular connectivity 572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 574 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 580 include hardware interfaces and connectors, as well as software components (e.g., drivers, protocol stacks) to make peripheral connections. It will be understood that the computing device 500 could both be a peripheral device ("to" 582) to other computing devices, as well as have peripheral devices ("from" 584) connected to it. The computing device 500 commonly has a "docking" connector to connect to other computing devices for purposes such as managing (e.g., downloading and/or uploading, changing, synchronizing) content on computing device 500. Additionally, a docking connector can allow computing device 500 to connect to certain peripherals that allow the computing device 500 to control content output, for example, to audiovisual or other systems.

In addition to a proprietary docking connector or other proprietary connection hardware, the computing device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus comprising a bonding nozzle comprising one or more channels in a bonding surface, the one or more channels comprising a first channel portion in an inner region of the bonding surface and a second channel portion along an outer periphery of the bonding surface, the one or more channels in fluid communication with a vacuum port; and a vacuum relief conduit within the bonding nozzle, the vacuum relief conduit comprising a first opening into the second channel portion along the outer periphery of the bonding surface and a second opening along an exterior wall of the bonding nozzle.

Example 2 includes all of the features of example 1, wherein the bonding nozzle has a rectangular periphery, wherein one or more channels of the second channel portion extend along orthogonal edges of the rectangular periphery, and wherein the one or more channels of the second channel portion has a first end and a second end.

Example 3 includes all the features of examples 1 or 2, wherein a first channel of the second channel portion is joined to a second channel of the second channel portion, wherein the first channel is orthogonal to the second channel.

Example 4 includes all of the features of example 3, wherein the vacuum relief conduit is a first vacuum relief conduit and opens into the first channel near the first end, and wherein a second conduit opens into the first channel near the second end.

Example 5 includes all of the features of example 4, wherein a third vacuum relief conduit opens into the first channel between the first and second vacuum relief conduits.

Example 6 includes all of the features of any one of examples 1 through 5, wherein a first portion of the vacuum relief conduit is orthogonal to the bonding surface and extends partially within the bonding nozzle, and wherein a second portion of the vacuum relief conduit is substantially parallel to the bonding surface and extends to the exterior wall of the bonding nozzle.

Example 7 includes all of the features of example 6, wherein the second portion opens to an ambient atmosphere that surrounds the bonding nozzle.

Example 8 includes all of the features of any one of examples 1 through 7, wherein a central conduit extends from a central region of the bonding surface through the bonding nozzle, wherein a first end of the central conduit is fluidically coupled to the first channel portion and a second end of the central conduit is coupled to the vacuum port on the bonding nozzle.

Example 9 includes all of the features of example 8, wherein the first channel portion comprises one or more interior channels extending between the central conduit and the second channel portion, wherein the one or more interior channels is in fluidic communication with the second channel portion.

Example 10 includes all of the features of example 9, wherein the one or more interior channels extend between the central conduit and the intersection of a first peripheral channel of the second channel portion and a second peripheral channel of the second channel portion, wherein the first peripheral channel is orthogonal to the second peripheral channel.

Example 11 is a system comprising a thermal compression bonder, the thermal compression bonder comprising a bonding nozzle comprising one or more channels in a bonding surface, the one or more channels comprising a first channel portion in an inner region of the bonding surface in fluidic communication with a second channel portion along an outer periphery of the bonding surface, the one or more channels in fluid communication with a vacuum port; and a vacuum relief conduit within the bonding nozzle, the vacuum relief conduit comprising a first opening into the second channel portion along the outer periphery of the bonding surface and a second opening along an exterior wall of the bonding nozzle.

Example 12 includes all of the features of example 11, wherein the first channel portion is fluidically coupled to the second channel portion and to a central conduit extending between a vacuum port and a central region of the bonding surface, wherein the central conduit is coupled to a vacuum source to create a vacuum within the first and second channel portions when the bonding surface is interfaced to a substrate.

Example 13 includes all of the features of example 12, wherein the first channel portion is fluidically coupled to the second channel portion and to a central conduit extending between a vacuum port and a central region of the bonding surface, wherein the central conduit is coupled to a vacuum source to create a vacuum within the first and second channel portions when the bonding surface is interfaced to a substrate.

Example 14 is a method for using a thermal compression bonder, the method comprising interfacing a bonding surface of a bonding nozzle to an integrated circuit (IC) die to be bonded to a substrate, the bonding surface comprising one or more channels, the one or more channels comprising a first channel portion within a central portion of the bonding surface fluidically coupled to a second channel portion along a periphery of the bonding surface; and forming a vacuum gradient within the one or more channels, wherein the vacuum gradient is minimal at the periphery of the bonding surface and maximal within the central portion of the bonding surface.

Example 15 includes all of the features of example 14, wherein interfacing the bonding surface of the bonding nozzle to the IC die comprises aligning the second channel portion with the edges of the IC die.

Example 16 includes all of the features of example 15, wherein forming a vacuum gradient within the one or more channels comprises coupling a vacuum source to the one or more channels, wherein an ambient atmosphere flows into the one or more channels through at least one vacuum relief conduit in fluidic communication with the second channel portion.

Example 17 includes all of the features of example 16, wherein forming a vacuum gradient within the one or more channels comprises providing metered suction of the ambient atmosphere through the at least one vacuum relief conduit such that the second channel portion has a smaller vacuum than the first channel portion.

Example 18 includes all of the features of example 17, wherein forming a vacuum gradient within the one or more channels comprises forming a vacuum gradient within the first channel portion that is decreases from the central region of the bonding surface toward the periphery of the bonding surface.

Example 19 includes all of the features of example 18, wherein interfacing the bonding surface of the bonding nozzle to the IC die comprises forming a clamping force gradient between the bonding surface and the IC die such that the clamping force is maximal within a central region of the IC die and minimal within a peripheral region of the IC die, and wherein the clamping force gradient is proportional to the vacuum gradient.

Example 20 includes all of the features of example 19, wherein forming the clamping force gradient comprises forming a symmetrical vacuum gradient between the central region of the IC die and the peripheral region of the IC die, wherein the clamping force is greatest within the central portion of the IC die and diminishes substantially equally in all directions from the central portion toward opposing edges of the IC die.

An abstract is submitted with the understanding that it will not be used to limit the scope or meaning of the claims. The following claims are hereby incorporated into the detailed description, with each claim standing on its own as a separate embodiment.

We claim:

1. An apparatus, comprising:
   a bonding nozzle comprising interconnected peripheral and interior channels within a bonding surface of the bonding nozzle and in fluid communication with a vacuum port; and
   a vacuum relief conduit comprising a first opening into at least one of the peripheral channels and a second opening to an ambient atmosphere surrounding the bonding nozzle, wherein the second opening is along an exterior wall of the bonding nozzle, and wherein a first portion of the vacuum relief conduit is orthogonal to the bonding surface and extends partially within the bonding nozzle, and wherein a second portion of the vacuum relief conduit is substantially parallel to the bonding surface and extends to the exterior wall of the bonding nozzle.

2. The apparatus of claim 1, wherein the bonding nozzle has a rectangular periphery, and wherein one or more of the peripheral channels extend along orthogonal edges of the rectangular periphery.

3. The apparatus of claim 2, wherein the first opening of the vacuum relief conduit opens into a first peripheral channel of the one or more peripheral channels near a first end of the first peripheral channel or between the first end and a second end of the peripheral channel.

4. The apparatus of claim 3, further comprising a second vacuum relief conduit having a third opening that opens into the first peripheral channel near the second end of the first peripheral channel.

5. The apparatus of claim 4, wherein the first opening of the vacuum relief conduit opens into the peripheral channel near the first end of the peripheral channel, the apparatus further comprising a third vacuum relief conduit having a fourth opening that opens into the first peripheral channel between the first end and the second end of the first peripheral channel.

6. The apparatus of claim 1, wherein the vacuum port opens to at least one of the interior channels.

7. The apparatus of claim 1, wherein a central conduit extends from a central region of the bonding surface through the bonding nozzle, wherein a first end of the central conduit is fluidically coupled to at least one of the interior channels and a second end of the central conduit is coupled to the vacuum port.

8. The apparatus of claim 1, further comprising:
   a thermal compression bonder body, the thermal compression bonder body comprising bonding nozzle and the vacuum relief conduit; and
   a platen adjacent the thermal compression bonder body.

9. An apparatus, comprising:
   a bonding nozzle comprising interconnected peripheral and interior channels within a bonding surface of the bonding nozzle and in fluid communication with a vacuum port, wherein the bonding nozzle has a rectangular periphery, and wherein one or more of the peripheral channels extend along orthogonal edges of the rectangular periphery;
   a first vacuum relief conduit comprising a first opening into a first peripheral channel of the one or more peripheral channels and a second opening to an ambient atmosphere surrounding the bonding nozzle, wherein the first opening opens into the first peripheral channel near a first end of the first peripheral channel;
   a second vacuum relief conduit having a third opening that opens into the first peripheral channel near a second end of the first peripheral channel; and
   a third vacuum relief conduit having a fourth opening that opens into the first peripheral channel between the first end and the second end of the first peripheral channel.

10. The apparatus of claim 9, wherein the second opening is along an exterior wall of the bonding nozzle.

11. The apparatus of claim 9, wherein the vacuum port opens to at least one of the interior channels.

12. The apparatus of claim 9, wherein a central conduit extends from a central region of the bonding surface through the bonding nozzle, wherein a first end of the central conduit is fluidically coupled to at least one of the interior channels and a second end of the central conduit is coupled to the vacuum port.

13. The apparatus of claim 9, further comprising:
    a thermal compression bonder body, the thermal compression bonder body comprising bonding nozzle and the vacuum relief conduit; and
    a platen adjacent the thermal compression bonder body.

14. An apparatus, comprising:
    a bonding nozzle comprising interconnected peripheral and interior channels within a bonding surface of the bonding nozzle and in fluid communication with a vacuum port, wherein the bonding nozzle has a rectangular periphery, and wherein one or more of the peripheral channels extend along orthogonal edges of the rectangular periphery; and
    a vacuum relief conduit comprising a first opening into a first peripheral channel of the one or more peripheral channels and a second opening to an ambient atmosphere surrounding the bonding nozzle, wherein the first opening opens into the first peripheral channel at a middle of the first peripheral channel between a first end and a second end of the first peripheral channel.

15. The apparatus of claim 14, further comprising a second vacuum relief conduit having a third opening that opens into the first peripheral channel near the first end of the first peripheral channel.

16. The apparatus of claim 14, further comprising a second vacuum relief conduit having a third opening that opens into a middle of a second peripheral channel between a first end and a second end of the second peripheral channel.

17. The apparatus of claim 14, wherein the second opening is along an exterior wall of the bonding nozzle, and wherein a first portion of the vacuum relief conduit is orthogonal to the bonding surface and extends partially within the bonding nozzle, and wherein a second portion of the vacuum relief conduit is substantially parallel to the bonding surface and extends to the exterior wall of the bonding nozzle.

18. The apparatus of claim 14, wherein the vacuum port opens to at least one of the interior channels.

19. The apparatus of claim 14, wherein a central conduit extends from a central region of the bonding surface through the bonding nozzle, wherein a first end of the central conduit is fluidically coupled to at least one of the interior channels and a second end of the central conduit is coupled to the vacuum port.

20. The apparatus of claim 14, further comprising:
   a thermal compression bonder body, the thermal compression bonder body comprising bonding nozzle and the vacuum relief conduit; and
   a platen adjacent the thermal compression bonder body.

* * * * *